(12) United States Patent
Miyake et al.

(10) Patent No.: US 6,598,780 B2
(45) Date of Patent: Jul. 29, 2003

(54) METHOD OF CONNECTING CIRCUIT BOARDS

(75) Inventors: Toshihiro Miyake, Inuyama (JP);
Koichi Shigematsu, Hoi-gun (JP);
Kazuya Sanada, Kariya (JP);
Hideharu Ishihara, Gifu (JP);
Yoshitaro Yazaki, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/740,264

(22) Filed: Dec. 20, 2000

(65) Prior Publication Data

US 2001/0013535 A1 Aug. 16, 2001

(30) Foreign Application Priority Data

Dec. 24, 1999 (JP) .............................. 11-368006
Mar. 30, 2000 (JP) ........................ 2000-094206
Aug. 3, 2000 (JP) ........................ 2000-235493

(51) Int. Cl.[7] .............................................. B23K 31/02
(52) U.S. Cl. ........................................ 228/223; 228/205
(58) Field of Search ..................... 228/180.21, 180.22, 228/205, 207, 223, 224; 428/618, 939, 624, 674; 148/23, 24

(56) References Cited

U.S. PATENT DOCUMENTS 4,360,144 A * 11/1982 Cuddy et al.
5,669,548 A    9/1997 Miyake et al.

FOREIGN PATENT DOCUMENTS

JP    60-140896    7/1985
JP    9-320662     12/1997

OTHER PUBLICATIONS

Vollhardt, Peter. 1995. Organic Chemistry, Second Edition. pp 74–75.*

* cited by examiner

Primary Examiner—Tom Dunn
Assistant Examiner—Jonathan Johnson
(74) Attorney, Agent, or Firm—Posz & Bethards, PLC

(57) ABSTRACT

The present invention provides a circuit board connecting method that includes an alkane application step and a heat-press-bonding step. The alkane application step is a preliminary step which applies an alkane group to a printed circuit board. The heat-press-bonding step heat-press-bonds a flexible circuit board to the printed circuit board by positioning their printed wire terminals and conductive thick-film terminals to face one another.

5 Claims, 14 Drawing Sheets

METHOD OF CONNECTING CIRCUIT BOARDS

CROSS-REFERENCE TO RELATED APPLICATION

The present invention is related to Japanese patent application No. Hei. 2000-94206, filed Mar. 30, 2000; 2000-235493, filed Aug. 3, 2000; 11-368006, filed Dec. 24, 1999, the contents of which are incorporated herein by reference.

FIELD OF THE INVENTION

The present invention relates to a method of bonding metal, and more particularly, a method of connecting the wiring on two circuit boards.

BACKGROUND OF THE INVENTION

In Japanese unexamined patent application publication Heisei 8-330726, a method of connecting the metal wiring on two circuit boards is disclosed, in which board electrodes are bonded together by solder due to the fact that the oxide film formed on the surface of the solder is broken down by the dilation energy of a boiling hydrocarbon compound.

However, when using the dilation energy of a hydrocarbon compound, even if the oxide film on the metal surfaces of the solder fused can be broken down at the time of bonding, the oxide film on the surfaces of the base metal composing the board electrodes cannot be removed because this base metal will not be fused. Thus, when solder is applied to only one side of a board electrode, sufficient bonding strength cannot be obtained. Presently, methods exist for using a press-bond connector which press-bonds and fixes two circuit boards and a method of using ACF (anisotropic conductive film). However, the method of using a press-bond connector does not prevent increased cost of the connector and an increased space for connection. The method of using the ACF, which is based on the point contact of conductive particles, does not prevent increased connection resistance and is also uncertain of the conductive reliability of the connecting section.

For dealing with this matter, there is disclosed a method of using insulating adhesive in JP-A No. S60-140896 referred to here as prior art 1, and a method of using conductive adhesive in JP-A No. H9-320662 referred to here as prior art 2.

However, both of the above-mentioned prior art references use adhesive and therefore take time for fixing regardless whether it is hot melt type or thermosetting adhesive. Therefore, these methods are not capable of bonding boards in a short time and necessitate much work for connection. Specifically, prior art 1 takes 20 seconds for heat-press-bonding of the connecting section.

Moreover, none of the prior art performs extremely low-cost bonding. Particularly, prior art 1 is designed to bond metallic lugs having a special shape which protrude from the printed circuit board, and therefore it is difficult to connect for low cost.

Moreover, insulating adhesive or thermoplastic resin used for bonding may flow into the terminal connecting section, resulting possibly in faulty conduction. The use of conductive adhesive can cause short-circuiting between adjacent terminals. Accordingly, none of the prior art references is sufficiently reliable for connection between terminals.

SUMMARY OF THE INVENTION

Accordingly, the object of the present invention is to provide a method of bonding metal in which sufficient bonding strength can be obtained.

Another object of the present invention is to provide a method of connecting a printed circuit board and a flexible circuit board, the method being capable of connecting these members at low cost and in a short time, while having the sufficient reliability.

In a first aspect of the invention, a hydrocarbon compound in which the energy of disassociation of the C—H bond is less than 950 kJ/mol is interposed between the connecting portion of the wiring on a first and a second circuit board. By heating the hydrocarbon compound, the hydrocarbon compound is decomposed and a radical is formed in which hydrogen has been separated from the hydrocarbon compound. Bonding occurs as the oxide film formed on the surface of the metal is reduced by this radical.

Here, the C—H bond disassociation energy $\Delta H$, as shown in FIG. 6, is the energy necessary for the alkyl group and the hydrogen to disassociate while the hydrocarbon compound retains each of their electrons, and is calculated after the electron orbit of each compound is determined. In other words, the C—H bond disassociation energy $\Delta H$ of each compound is the ease in which alkyl groups and hydrogen on the hydrocarbon compound can be disassociated. The smaller this compound's energy is, the easier it is for alkyl groups and hydrogen to disassociate.

Then, as shown in FIG. 6, when the alkyl group and hydrogen disassociate while retaining each of their electrons, that alkyl group becomes a radical, takes away oxygen from copper oxide or the like, or in other words, reduces the copper oxide, and turns into a stable alkane oxide compound. In this way, sufficient bonding strength can by obtained by using a hydrocarbon compound which demonstrates a reducing action by means of its heat decomposition.

In another aspect of the invention, a circuit board connecting method comprises using an alkane application step of applying an alkane group to at least the surface of a printed circuit board where printed wire terminals exist or a portion of the surface of a flexible circuit board where conductive thick-film terminals exist, and a heat-press-bonding step of bonding the flexible circuit board to the printed circuit board by heat-pressing, while positioning the printed wire terminals and the conductive thick-film terminals to face one another.

The base plate of the printed circuit board has an epoxy glass board not confined. For example, resin boards based on other resin excluding multiple boards and multiple materials can be used, or other ceramic circuit boards, etc. can also be used. The printed wire terminals are typified by a printed pattern of copper foil, etc. that is not confined. For example, a gold or silver foil, a gold-plated conductor, or a conductive paste, etc. called a conductive thick film can be used.

The flexible circuit board is also called flexible printed circuit board, and is a flexible and plastic printed circuit board. The thermoplastic resin for forming the film which is the base of the flexible circuit board is typified by PEN (polyethylene naphtalate having a fusing point of around 270–280° C.), but it is not confined. For example, PET (polyethylene terephthalate having a fusing point of around 340° C.), PEEK (polyether ketone having a fusing point of around 340° C.), or PPS (polyphenylensulfide having a fusing point of around 250° C.) can be used.

The conductive thick-film terminals of the flexible circuit board are typified by conductive paste such as silver paste, but it is not confined, and they may be formed of a metallic foil, etc. The conductive paste can be gold paste, aluminum paste, copper paste, etc. besides the silver paste.

The alkane group applied can be any proper saturated hydrocarbon, even though it is not a straight-chain type, and the alkane group may even include an impurity which is harmless for bonding. Alkane which is the main component of the alkane group preferably has a boiling point within a proper range lower than the fusing point of the thermoplastic resin which forms the film of the flexible circuit board. The ones which are somewhat outside the range are still usable. Even materials which slightly differ from alkane groups and have constituents other than the methyl group, such as alcohol groups or ether groups, can be used. However, materials other than alkane group develop polarity, which results in the generation of ions, and therefore the use of alkane groups is still desirable to prevent short-circuits.

This means initially carries out an alkane application step for the preliminary step, and thereafter proceeds to a heat-press-bonding step for the main bonding step so that a flexible circuit board is connected to the printed circuit board.

In the initial alkane application step, alkane group is applied to at least either the portion of the surface of the printed circuit board where printed wire terminals exist or the portion of the surface of the flexible circuit board where conductive thick-film terminals exist.

In the ordinary bonding process, in which a printed circuit board is placed and a flexible circuit board is bonded upside down to it, it is preferable to have the application step for the printed circuit board which faces upward. There is no restriction on the manner of application, and it can be the use of a brush or roller means or it can be spray application. Accordingly, the alkane application step can be finished in a short time.

The alkane application step is the preliminary step for the heat-press-bonding step explained next, and it is solely intended to put a small amount of alkane group on the bonding surface of the printed circuit board or flexible circuit board prior to the heat-press-bonding step.

At the subsequent heat-press-bonding step, the flexible circuit board is heat-press-bonded to the printed circuit board, with the printed wire terminals and the conductive thick-film terminals being positioned to face one another. For heat-press-bonding the flexible circuit board to the printed circuit board, a heating tool such as a heated metallic block is brought in press-contact with the flexible circuit board, or the flexible circuit board and printed circuit board in a state of press-contact are subjected to ultrasonic heating.

When the flexible circuit board is heat-press-bonded to the printed circuit board in the heat-press-bonding step, the alkane group which has been applied in advance acts in two ways as follows.

Firstly, the alkane group is heated to a temperature above the boiling point to boil instantaneously, cleaning the surface of the printed wire terminals of the printed circuit board and the surface of the conductive thick-film terminals of the flexible circuit board so that both members can be easily bonded. Specifically, boiling removes the oxide film formed on the surface of the printed wire terminals of the printed circuit board, causing the metallic portion which is not oxidized inside the printed wire terminals to be exposed. Similarly, boiling removes the contaminant which covers the surface of the conductive thick-film terminals of the flexible circuit board, causing the metallic portion of the conductive thick-film terminals to be exposed.

The alkane group, which is saturated hydrocarbon, is low in its C—H bond-dissociation energy and has some reducing action. Therefore, in the formation of metal oxide on the surface of the printed wire terminals and conductive thick-film terminals, the alkane group reduces the oxide back to metal. As a result, the oxide is thoroughly removed from the surface of the printed wire terminals and conductive thick-film terminals, causing their metallic surface to be exposed.

Consequently, the metallic portion of the printed wire terminals and the metallic portion of the conductive thick-film terminals are exposed and press-bonded to one another by being in direct contact at a high temperature. As a result, both members are bonded firmly to one another, which not only achieves a strong mechanical bond, but also achieves the satisfactory conduction based on the firm electrical connection.

Secondly, the heated alkane group soaks into the material (epoxy glass, etc.) which forms the film of the flexible circuit board or the base plate of the printed circuit board, causing the material to swell. Consequently, the thermoplastic resin which forms the film is heated to fuse and swell, sealing the space between adjacent terminals and sticking firmly to the surface of the base plate between the printed wire terminals on the surface of the printed circuit board and the side face of the printed wire terminals. As a result, the printed circuit board and the flexible circuit board are bonded firmly to have an enhanced strength against peeling, and both members are firmly bonded mechanically. Moreover, the film seals the portion between terminals, preventing the short-circuiting and erosion caused by emerging dew.

Namely, the heat-press-bonding step not only firmly connects the printed wire terminals and the conductive thick-film terminals electrically and mechanically, but it also bonds the printed circuit board and the flexible circuit board mechanically. The sealed bonding section prevents short-circuiting caused by ions between adjacent terminals and also prevents the short-circuiting and erosion caused by emerging dew. As a result, the reliability of connection between the printed circuit board and the flexible circuit board is improved.

Also, thermoplastic resin which forms the film of the flexible circuit board swells to fill the space of the bonding section and seal the bonding section, making the bonding section to hardly develop the short-circuiting or defective connection due to emerging dew, whereby a high reliability of connection is achieved. Also, the circuit board connecting scheme based on this means achieves the sufficient connection reliability.

Further areas of applicability of the present invention will become apparent from the detailed description provided hereinafter. It should be understood that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein.

DETAILED DESCRIPTION OF THE INVENTION

Below, the first embodiment of this invention will be explained in accordance with the figures.

Figure 5:
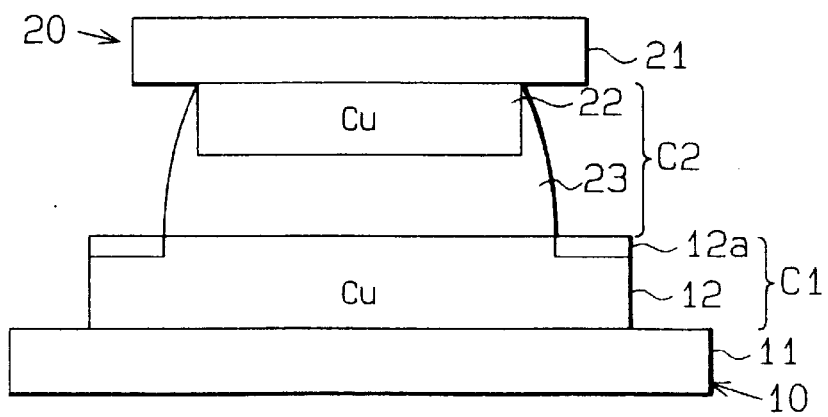
FIG. 5 is a cross-sectional view for explaining a mounting method according to the present invention.

In FIG. 5, a second circuit board 20 is mounted on top of a first circuit board 10, and shows the connection between the wiring of each. Specifically, it shows the state after a connection has been completed. In the present embodiment, the first circuit board employs a printed wiring board (PWB) thereon. This circuit board 10 includes an insulation substrate 11, on the surface of which is formed a metal wiring connector C1. The metal wiring connector C1 is composed of a metal electrode 12 composed of copper. The second circuit board 20 employs a flexible wiring board (FWB) thereon. This circuit board 20 includes an insulation substrate 21, on the surface of which is formed a metal wiring connector C2. The metal wiring connector C2 is composed of a metal electrode 22 composed of copper, and solder 23, which is attached to and covers metal electrode 22.

In this type of embodiment, the metal wiring connectors C1 and C2 of the first and second circuit boards are composed of metal electrodes 12 and 22 respectively, and are configured such that at least one side of metal electrode 22 is placed and attached on top of at least one side of metal electrode 12 by means of solder 23. Then, metal wiring connector C1 on the first circuit board 10 is bonded to metal wiring connector C2 on the second circuit board (the copper terminal and the solder coated copper terminal are bonded together). In this way, metal wiring connector C1 of the first circuit board and metal wiring connector C2 of the second circuit board are connected together.

Figure 1:
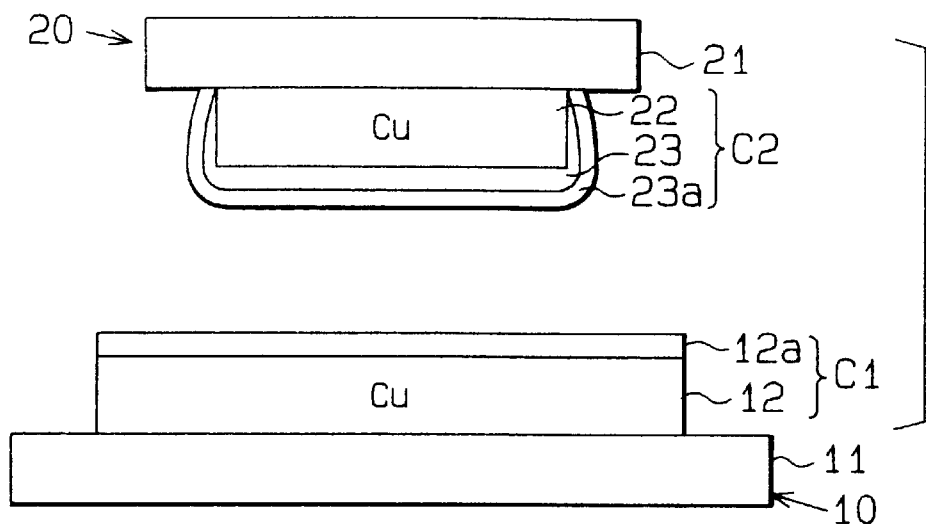
FIG. 1 is a cross-sectional view explaining the mounting method in the first embodiment of the present invention.

Next, FIGS. 1–5 will be used to explain the method of production. First, as shown in FIG. 1, first circuit board (PWB) 10 and second circuit board (FPC) 20 are prepared. At this time, the surface of metal wiring connector (copper wiring) C1 on the first circuit board 10 has an oxide film formed thereon due to air oxidation. Further, the surface of solder 23 on metal wiring connector C2 on the second circuit board 20 has an oxide film formed thereon due to air oxidation.

Figure 2:
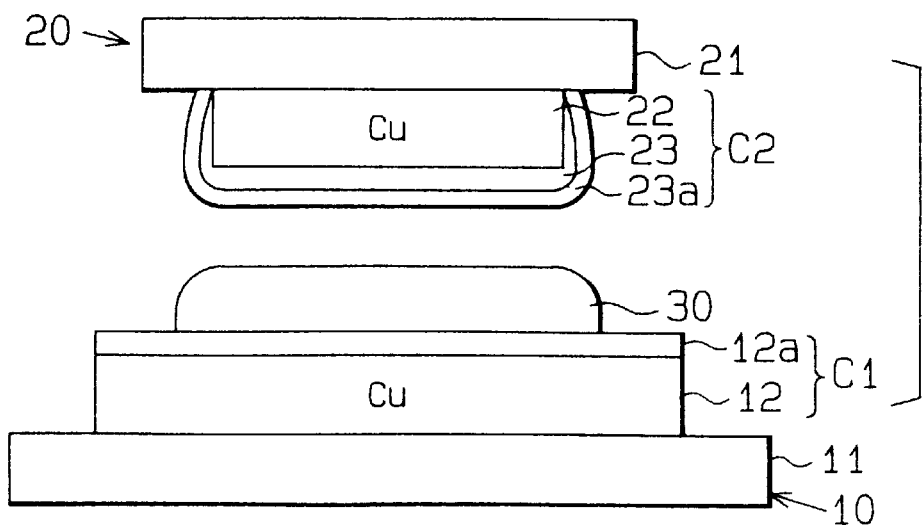
FIG. 2 is a cross-sectional view for explaining a mounting method according to the present invention.

Then, as shown in FIG. 2, a hydrocarbon compound 30 with a C—H bond disassociation energy lower than 950 kJ/mol is applied to metal wiring connector (copper wiring) C1 on the first circuit board 10. This hydrocarbon compound can be at least one selected from the group consisting of cyclooctane, tetramethyl pentadecane, triphenyl methane, dicyclopentadiene, or dihydroanthracene.

Figure 3:
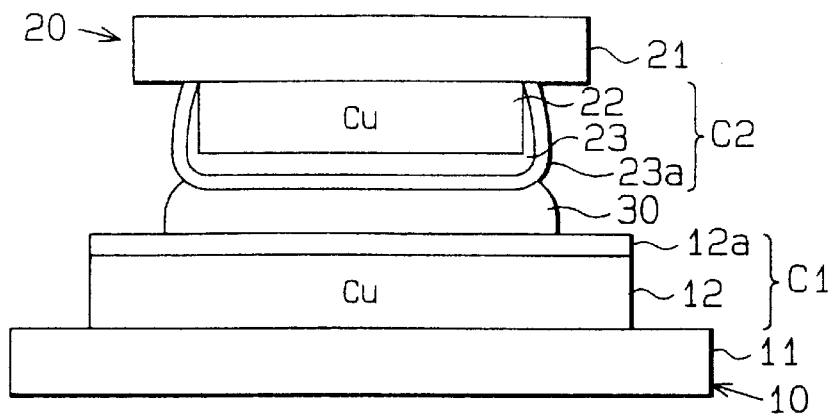
FIG. 3 is a cross-sectional view for explaining a mounting method according to the present invention.

Continuing, as shown in FIG. 3, the second circuit board 20 is placed on top of the first circuit board 10 such that metal wiring connectors C1 and C2 are opposite one another. By this means, the hydrocarbon compound 30 with a C—H bond disassociation energy lower than 950 kJ/mol can be interposed between the metal composing metal wiring connector C1 on the first circuit board and the metal composing the metal wiring connector C2 on the second circuit board, and the metal wiring connectors C1 and C2 on both boards can be disposed opposite each other.

Then, when pressure is applied between metal wiring connectors C1 and C2 on both boards 10 and 20, the solder 23 is heated above its melting point. The amount of pressure applied is, for example, 0.3 to 2.0 MPa. Further, pressure and heating is applied from 1 to 10 seconds.

Figure 4:
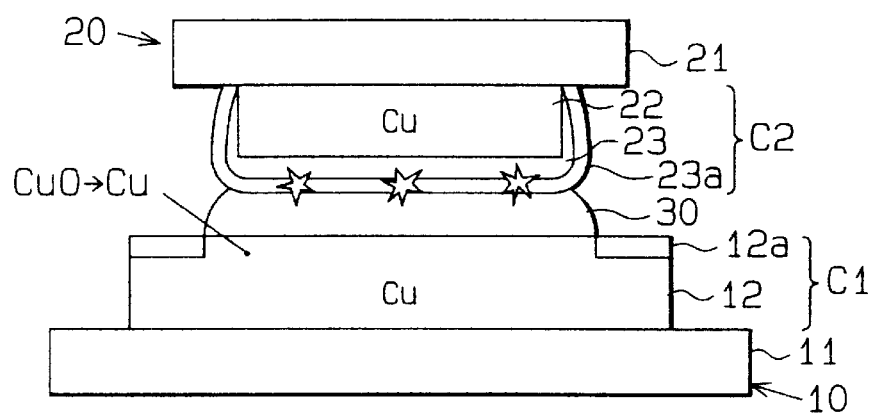
FIG. 4 is a cross-sectional view for explaining a mounting method according to the present invention.
Figure 6:
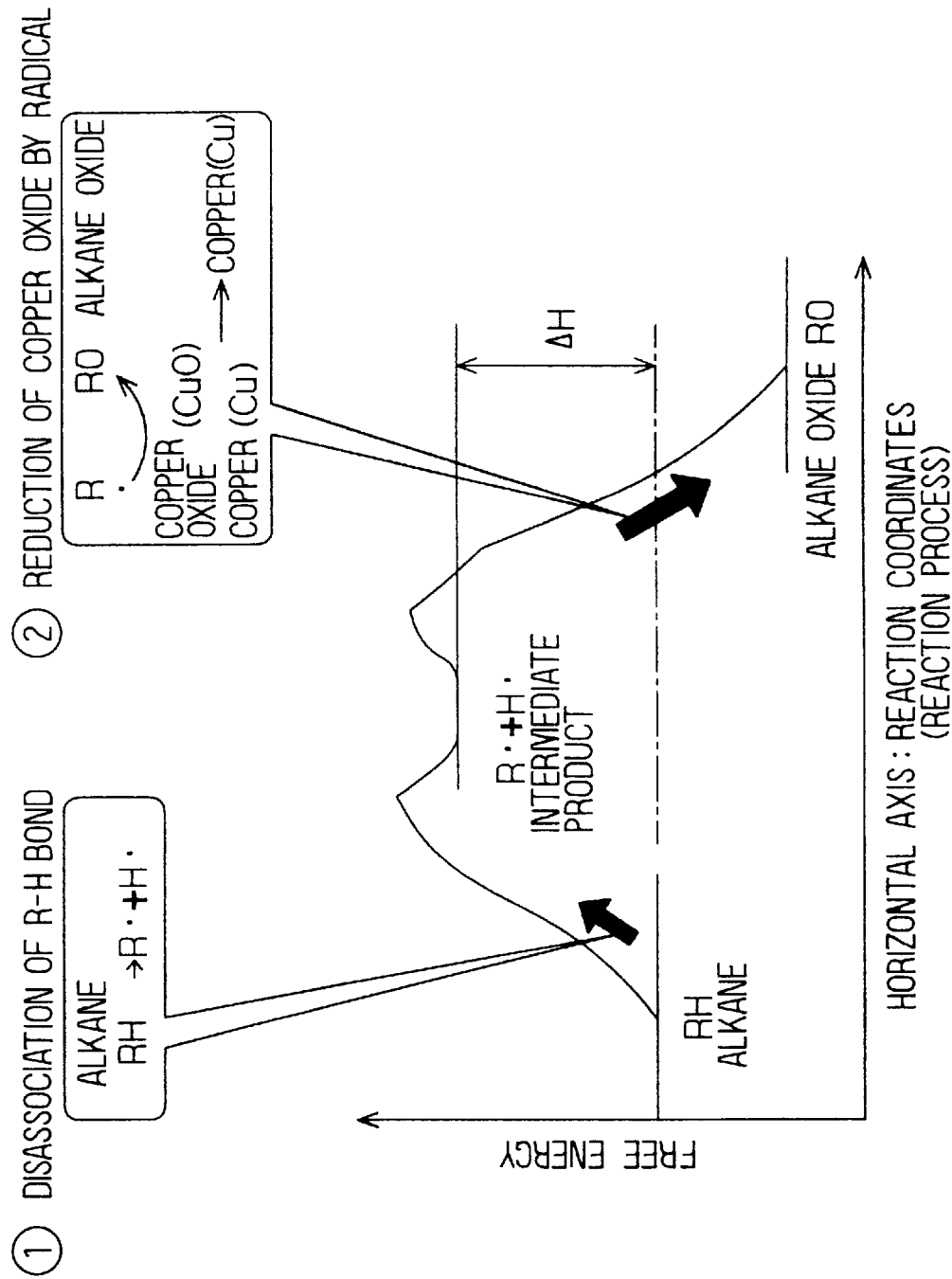
FIG. 6 is a figure for explaining the copper oxide reduction reaction by an alkane.

At this time, as shown in FIGS. 4 and 6, by heating hydrocarbon compound 30, hydrocarbon compound 30 is decomposed, and hydrocarbon compound 30 has hydrogen detached therefrom and turns into a radical. While reducing the oxide film 12a and 23a formed on the metal surfaces by means of the radicalized hydrocarbon compound 30, the metal composing the metal wiring connectors C1 and C2 on both boards is bonded together by means of the fusing of metal (solder). In other words, the oxide film 12a and 23a is removed by the reduction of oxide film 12a and 23a, and a clean metal surface is exposed. In the state in which wetness is good, the surface of copper film 12 on board 10 contacts with the surface of solder 23 on board 20. Moreover, as shown in FIG. 5, accompanied by the melting of solder 23, solder 23 on board 20 is bonded together with copper film 12 on board 10. In this type of embodiment, by heating hydrocarbon compound 30 to a temperature above the melting point of solder 23, the oxide film 12a and 23a on the surfaces of metal electrode 12 or solder 23 is reduced by hydrocarbon compound 30 as the metal electrodes 12 and 22 on both boards bond together by fusing with solder 23.

In this way, the oxide film 12a and 23a on the surfaces of the base metal (in the present example, copper film 12) and solder 23 are eliminated, the base metal and solder 23 are connected, and a highly reliable connection between component packages (the connection between the wiring) becomes possible. In other words, by using hydrocarbon compound 30 (a hydrocarbon compound in which the disassociation energy of the C—H bond is less than 950 kJ/mol) to reduce the oxide films 12a and 23a on the surfaces of the metal, clean metal surfaces can be contacted and fixed together with solder, and a good connection with high reliability can be obtained.

In the present embodiment of this type, by using the reducing action exhibited by hydrocarbon compound 30, suitable bond strength can be obtained. In other words, by using a specific hydrocarbon compound with a C—H bond disassociation energy less than 950 kJ/mol as hydrocarbon compound 30, the hydrocarbon compound can be made to exhibit a reducing action.

The present inventors have conducted various experiments in regard to bonding theory, and explain this as follows.

(i) The levels of hydrogen and water generated when copper oxide was soaked and heated in every species of liquid hydrocarbon compound were determined. The results were that the occurrence of hydrogen was confirmed, but water was not detected. Because of this, it was confirmed that the reduction of copper oxide cannot be accomplished by means of hydrogen.

(ii) The reaction product generated when copper oxide was soaked and heated in every species of liquid hydrocarbon compound was analyzed. The results were that the presence of oxidized hydrocarbon compounds was confirmed (for example, in the case of cyclooctane, the presence of cyclooctanone and cyclooctanol were confirmed). By this means, it was determined that there is a possibility that hydrocarbon compounds reduce copper oxide.

Figure 7:
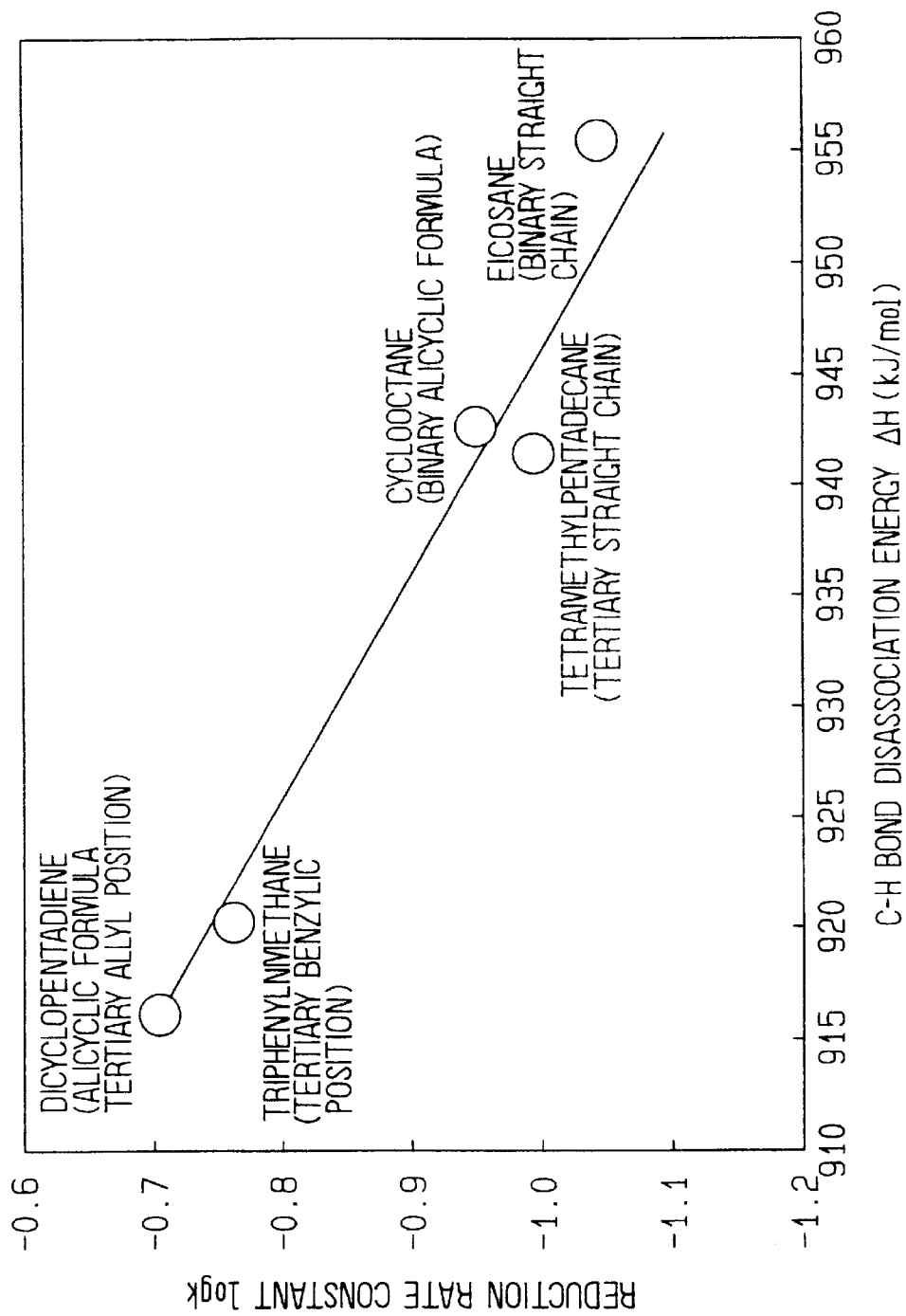
FIG. 7 is a figure showing the relation between the C—H bond disassociation energy and the reduction rate constant according to the present invention.
Figure 8:
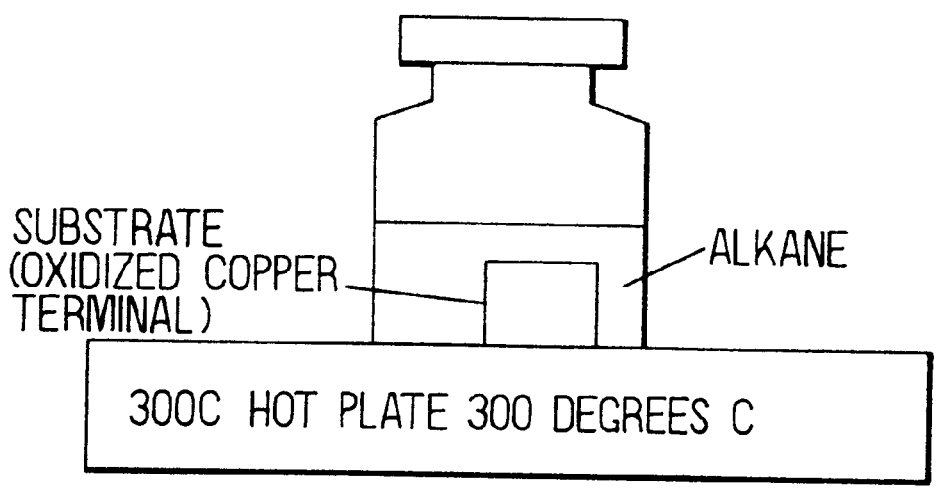
FIG. 8 is a figure for explaining the method of measuring the copper oxide reduction rate according to the present invention.

(iii) To confirm whether the conclusion drawn in (ii) was correct, the relationship between the C—H bond disassociation energy and the reduction rate constant was sought. The results of this are shown in FIG. 7. The horizontal axis of FIG. 7 is the C—H bond disassociation energy Delta H, and the vertical axis is the reduction rate constant. The samples used were dicyclopentadiene, triphenylmethane, cyclooctane, tetramethylpentadecane, and eicosane. Here, as shown in FIG. 8, a substrate (an oxidized copper electrode) is placed into a trial subject and heated for a fixed period at 300 degrees Centigrade, the oxygen on the surface of the copper electrode is analyzed with dispersed wavelength X-ray spectroscopy, and the reduction rate constant is determined by means of the following formula.

Reduction rate constant=(1−$X$/$X1$)/($t$ times $X$)

Where:
$X1$ is the X ray count in the first oxidation state
$X$ is the X ray count at each interval of elapsed time
$T$ is time of heating (seconds)

These results, as shown in FIG. 7, confirm the relation that the smaller the C—H bond disassociation energy becomes, the larger the reduction rate. Because of this, it was confirmed that copper oxide and the like is reduced by hydrocarbon compounds that have become radicals.

Figure 9:
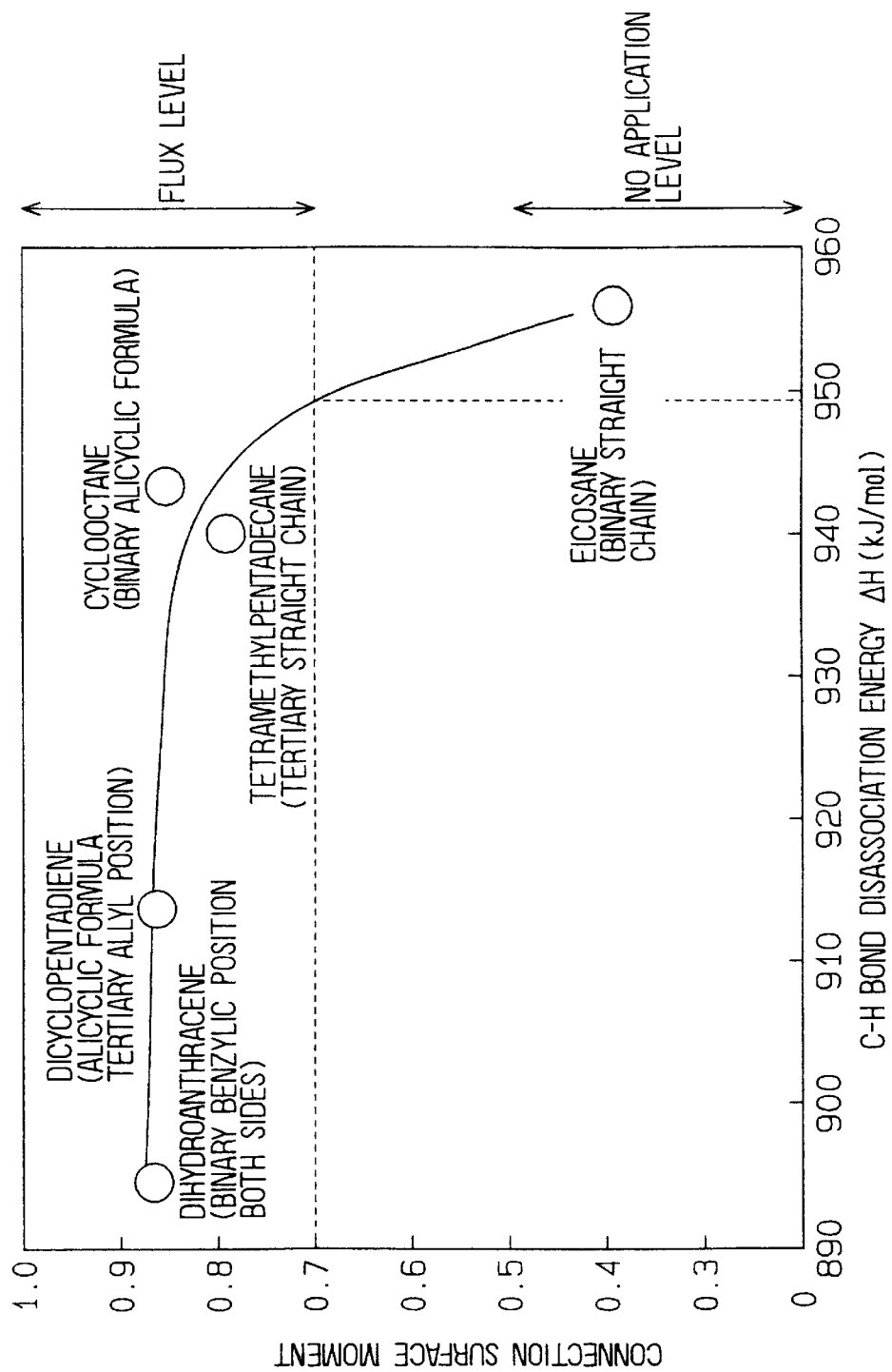
FIG. 9 is a figure showing the relationship between C—H bond disassociation energy and the connection surface moment according to the present invention.

Using a species substance in which the C—H bond disassociation energy is relatively low at the point where bonding between the copper terminal and the solder covered terminal occurs, as shown in FIG. 9, with respect to a hydrocarbon compound with a C—H bond disassociation energy of less than 950 kJ/mol, the prior art flux and the equivalent connection surface moment can be obtained, and sufficient bonding strength can be ensured (the smaller the C—H bond disassociation energy, the more favorable the bonding characteristics). The details are shown in FIG. 9, in which the horizontal axis is the C—H bond disassociation energy Delta H, the vertical axis is the connection surface moment, and the samples used were dihydroanthracene, dicyclopentadiene, cyclooctane, tetramethylpentadecane, and eicosane. Here, with respect to the connection surface moment, if one were to make (hypothetically) a square observation window using the short end of the rectangle forming the bonding area, and bring said observation window to the area in the rectangular bonding area in which the bonding is worst, the window's contents will face the entire area and the actual bonding area ratio demanded. The results are that in order to have a connector surface moment above 0.7 when using a flux, it is understood that it is desirable to use a substance having a C—H bond disassociation energy of less than 950 kJ/mol.

In addition, with respect to bonding without using flux, in soldering, previously flux was used and after bonding was cleaned up. However, because cleaning became difficult because of environmental problems, and because a problem was created in which flux residue causes a decline in insularity, when soldering and not using flux, the effect of oxide on the connection area does not ensure a sufficient connection, and connection reliability is poor. Thus, it is useful to not use flux and to break down the oxides in order to ensure good connectivity. Further, in the present method, a flux-like metal is not melted, and there is no decrease in insularity so as to not create metal ion activity. In other words, the reduction reaction of the present method does not create metal ions so that oxygen can be pulled away from the oxide.

Next, a second embodiment will be explained with emphasis on the points of difference with the first embodiment.

In the first embodiment, solder is used to bond the copper terminal and the solder coated copper terminal together. However, in the present embodiment, the metals composing both terminals are bonded together by mutual dispersion.

Figure 14:
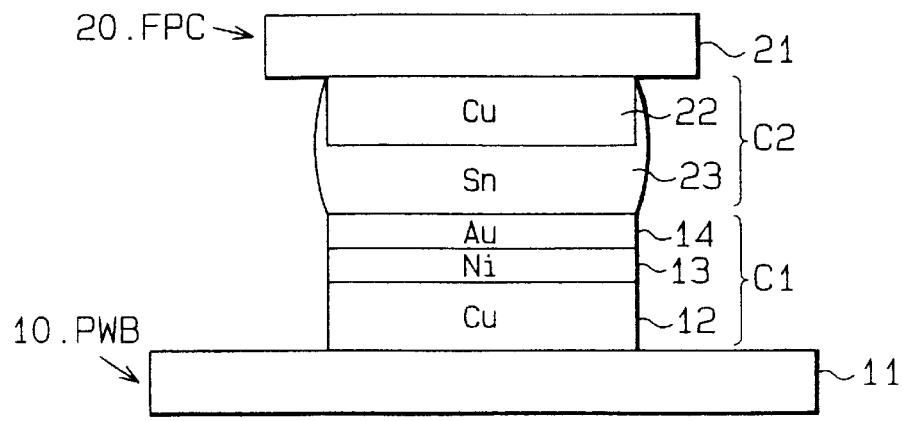
FIG. 14 is a cross-sectional view showing the mounting method of the second embodiment according to the present invention.

In FIG. 14, a second circuit board 20 is mounted on top of a first circuit board 10, and the wiring on each is in the connected state. In other words, FIG. 14 shows the state after connection.

A metal wiring connector C1 is formed on the surface of an insulating substrate 11 on the first circuit board (PWB) 10. A metal wiring connector C1 is composed of a metal electrode 12 formed from copper, a nickel film 13 attached to and covering the surface of the copper electrode 12, and a gold film 14 formed on top of the nickel film 13.

A metal wiring connector C2 is formed on the surface of an insulating substrate 21 on the second circuit board (FPC)

20. A metal wiring connector C2 is composed of a metal electrode 22 formed from copper, and a tin film 23 attached to and covering the surface thereof.

Then, the gold film 14 on the first circuit board 10 and the tin film 23 on the second circuit board 20 are bonded together by the mutual diffusion of both metals. In this way, the metal wiring connector C1 on the first circuit board 10 is connected with the metal wiring connector C2 on the second circuit board.

Figure 10:
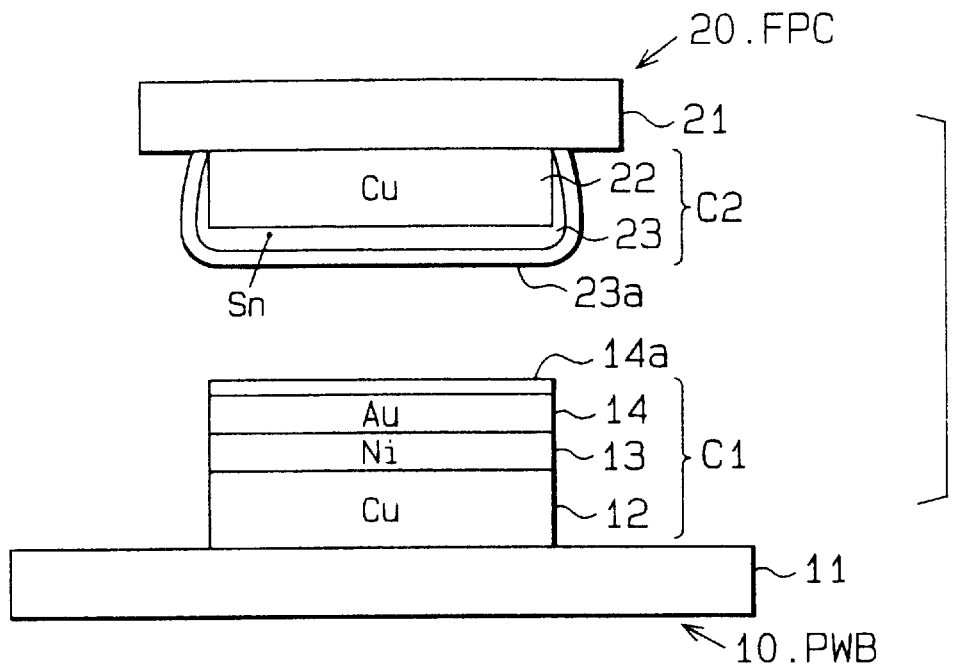
FIG. 10 Cross-sectional view for explaining the mounting method of the second embodiment according to the present invention.

Next, the method of production will be explained with the use of FIGS. 10–14. First, as shown in FIG. 10, first circuit board (PWB) 10 and second circuit board (FPC) 20 are prepared. At this time, an oxide film 14a is formed by air oxidation on the surface of the gold film 14 on the metal wiring connector C1 of first circuit board 10. Further, an oxide film 23a is formed by air oxidation on the surface of the tin film 23 on the metal wiring connector C2 of second circuit board 20.

Figure 11:
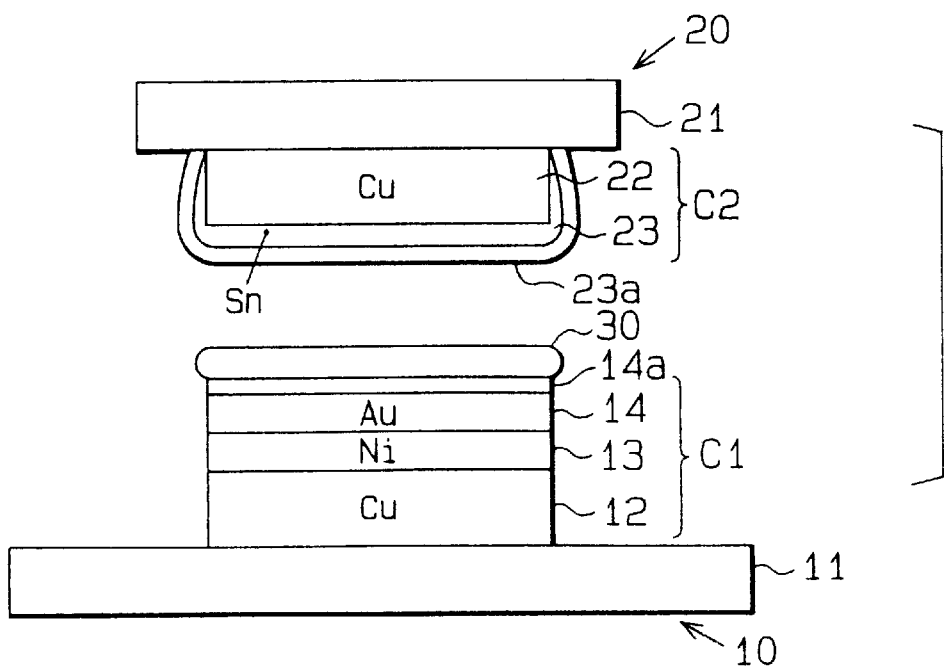
FIG. 11 is a cross-sectional view showing the mounting method of the second embodiment according to the present invention.

Then, as shown in FIG. 11, a hydrocarbon compound with a C—H bond disassociation energy less than 950 kJ/mol is applied on top of gold film 14 of the first circuit board 10.

Figure 12:
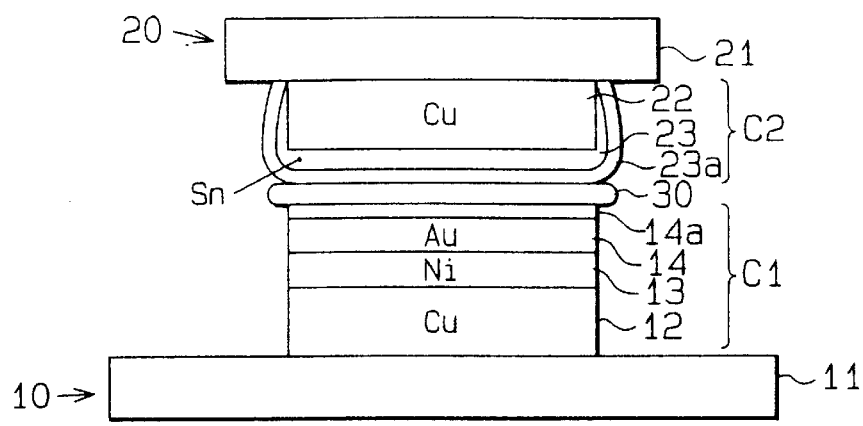
FIG. 12 is a cross-sectional view showing the mounting method of the second embodiment according to the present invention.

Continuing, as shown in FIG. 12, the second circuit board 20 is placed on top of the first circuit board 10 such that metal wiring connectors C1 and C2 oppose each other. By this means, metal wiring connectors C1 and C2 of both boards 10 and 20 are disposed opposite one another in a state in which hydrocarbon compound 30 is interposed between the metal (14) of the first circuit board 10 and the metal (23) of the second circuit board 20. In other words, metal wiring connectors C1 and C2 of both boards 10 and 20 are disposed opposite one another in a state in which hydrocarbon compound 30 having a disassociation energy less than 950 kJ/mol is interposed between the metal composing metal wiring connector C1 on the first circuit board 10 and the metal composing metal wiring connector C2 on the second circuit board 20.

Then, while applying pressure between metal wiring connectors C1 and C2 of both boards 10 and 20, the metal (gold) 14 on the first circuit board 10 and the metal (tin) 23 on the second circuit board 20 is heated to below the melting point of tin. The amount of pressure applied is, for example, 0.3 to 2.0 MPa. Further, the heating temperature is between 180 and 200 degrees Centigrade, lower than the melting point of tin (232 degrees Centigrade). Moreover, the time in which pressure is applied and heating occurs is between 1 and 10 seconds.

Figure 13:
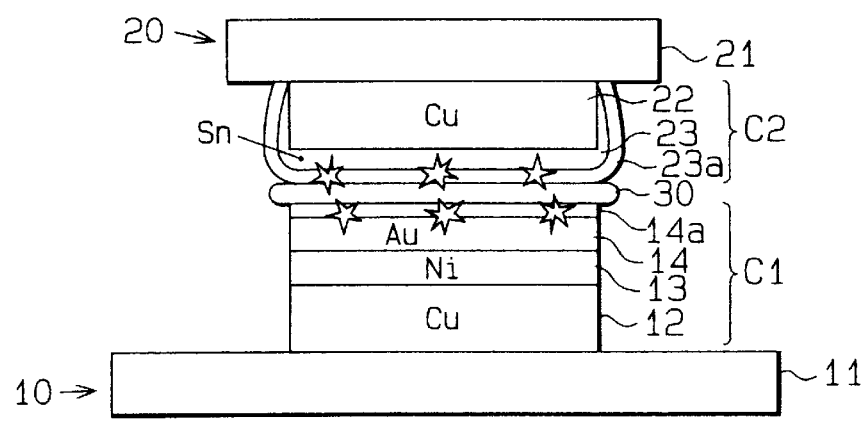
FIG. 13 is a cross-sectional view showing the mounting method of the second embodiment according to the present invention.

At this time, as shown in FIG. 13, by heating hydrocarbon compound 30, hydrocarbon compound 30 decomposes, and hydrocarbon compound 30 forms a radical by disassociating hydrogen therefrom. While reducing the oxide film 14a and 23a formed on the surface of metal by means of the hydrocarbon compound radical, metal wiring connectors C1 and C2 on both boards 10 and 20 bond by means of the diffusion of metal.

That is, the oxide film 14a on the surface of gold film 14 and the oxide layer 23a on the surface of tin film 23, in other words, the oxide layer 14a and 23a on the surface of metal 14 and 23 on the first and second circuit boards 10 and 20, is reduced by means of hydrocarbon compound 30. The oxide film 14a and 23a is removed by the reduction of oxide film 14a and 23a, and a clean metal surface is exposed. In the state in which wetness is good, the surface of gold film 14 on board 10 contacts with the surface of tin film 23 on board 20. Then, the mutual diffusion of gold and tin takes place, and as shown in FIG. 14, tin 23 on board 20 is bonded together with gold film 23 on board 10.

In the present embodiment of this type, when metal wiring connector C1 on the first circuit board 10 contains gold, metal wiring connector C2 on the second circuit board 20 contains tin, and hydrocarbon compound 30 is interposed between this gold and tin, by heating to below the melting point of tin, both metals can bond by means of diffusion.

In this way, the oxide films 14a and 23a on the surface of the base metals (in this embodiment, gold film 14 and tin film 23) is eliminated and the base metals bond, and a highly reliable connection between parts packages (the connection between the wiring) becomes possible. In other words, by using hydrocarbon compound 30 to reduce the oxide films 14a and 23a on the surface of the metals, clean metal surfaces can be contacted and mutual diffusion can occur, and a good connection with high reliability can be obtained.

Further, because there is no soldering process, the means of bonding is inexpensive. Moreover, in the case of soldering, there is an electrode pitch limit of 0.3 mm. However, if the present method is used, bonding can occur at an electrode pitch lower than 0.3 mm. In other words, the solder mounting method is unsuitable for minute connections, and in the alloy method, because alloy spills out beyond its intended area, it is also unsuitable for minute connections. However, by using the present method, it can be applied to products that have a minute pitch. More particularly, in recent years, the demand on the electrode pitch of component packages and connector technology has risen. However, the solder mounting method is unsuitable for minute connections, and in the soldering method, there is an electrode pitch limit of 0.3 mm. Further, in the same way, in the alloy method, because the alloy spills out beyond its intended area, it is also unsuitable for minute connections. However, the present embodiment can be applied to products having a minute pitch.

As above, even in the case where the electrode space is small, a high connection reliability in component packages (the connection between wiring) can be carried out.

Third Embodiment

Next, a third embodiment will be explained with emphasis on the points of difference with the second embodiment.

Figure 19:
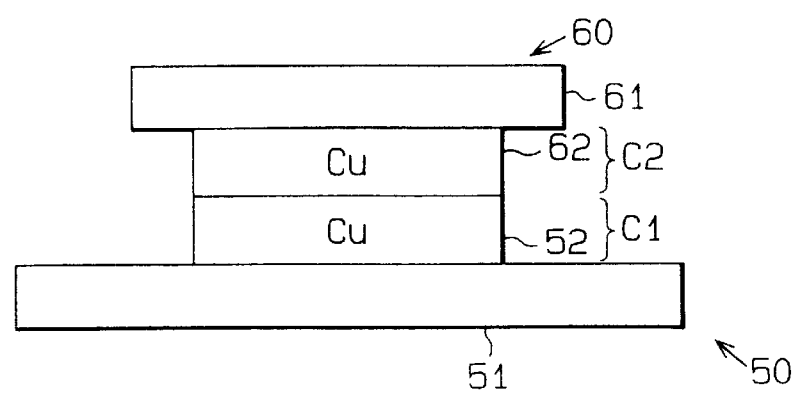
FIG. 19 is a cross-sectional view showing the mounting method of the second embodiment according to the present invention.

In FIG. 19, a second circuit board 60 is mounted on top of a first circuit board 50, and the wiring on each is in the connected state. In other words, FIG. 14 shows the state after connection.

In the first circuit board 50, metal wiring connector C1 is formed on the surface of insulation substrate 51. Metal wiring connector C1 is composed of metal electrode 52 and is constructed of copper. Further, an alumina substrate is used for insulating substrate 51. In the second circuit board 60, metal wiring connector C2 is formed on the surface of insulation substrate 61. Metal wiring connector C2 is composed of metal electrode 62 and is constructed of copper. Further, an alumina substrate is used for insulating substrate 61.

Then, metal wiring connector (copper wiring) C1 of first circuit board 50 and metal wiring connector (copper wiring) C2 of the second circuit board 60 are bonded together by mutual diffusion. In this way, metal wiring connector C1 of first circuit board 50 and metal wiring connector C2 of second circuit board 60 are connected together.

Next, the method of production will be explained by using FIGS. 15 to 19.

Figure 15:
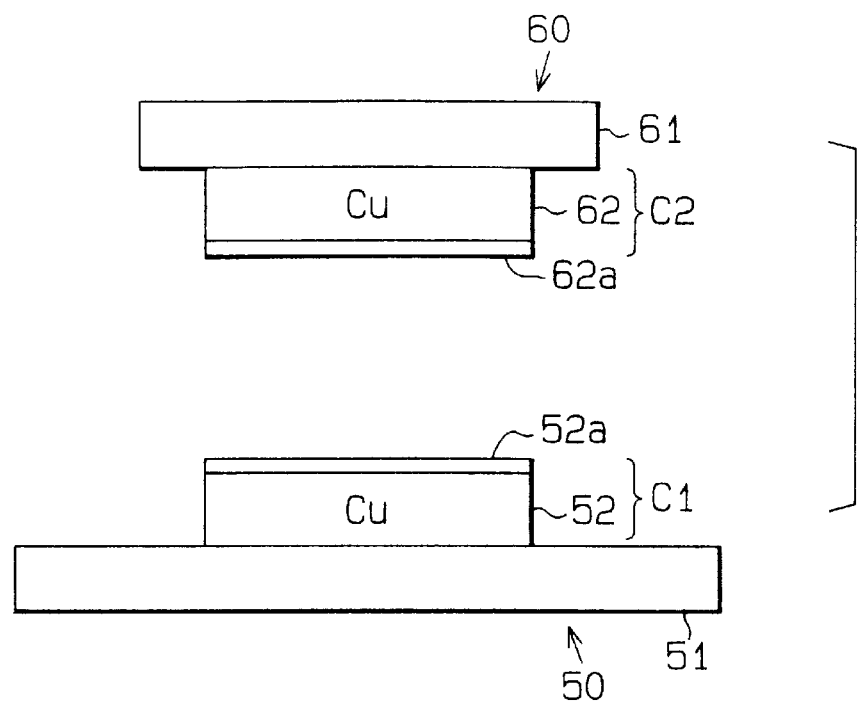
FIG. 15 is a cross-sectional view showing the mounting method of the second embodiment according to the present invention.

First, as shown in FIG. 15, first circuit board 50 and second circuit board 60 are prepared. At this time, in first circuit board 50, oxide film 52a is formed on the surface of metal wiring connector (copper wiring) C1 by air oxidation. Similarly, in second circuit board 60, oxide film 62a is formed on the surface of metal wiring connector (copper wiring) C2 by air oxidation.

Figure 16:
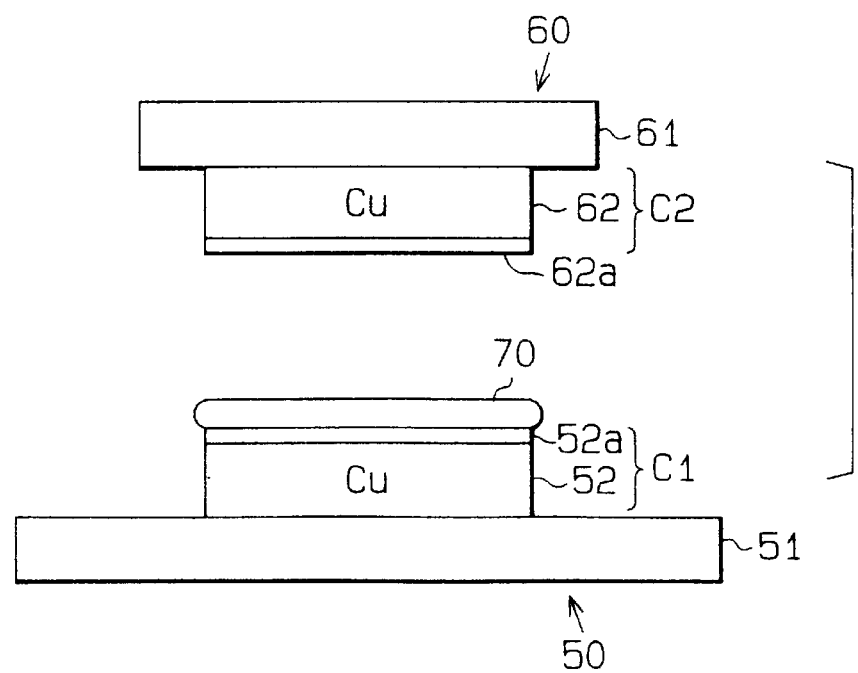
FIG. 16 is a cross-sectional view showing the mounting method of the second embodiment according to the present invention.

Then, as shown in FIG. 16, a hydrocarbon compound having a C—H bond disassociation energy less than 950 kJ/mol is applied on top of metal wiring connector (copper wiring) C1 of first circuit board 50. The hydrocarbon compound is at least one selected from the group consisting of cyclooctane, tetramethylpentadecane, tryphenylmethane, dicyclopentadiene, and dihydroanthracene.

Figure 17:
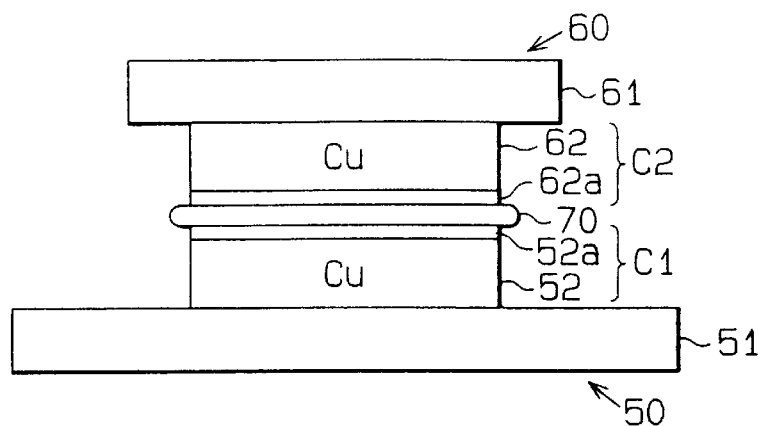
FIG. 17 is a cross-sectional view showing the mounting method of the second embodiment according to the present invention.

Continuing, as shown in FIG. 17, second circuit board 60 is placed on top of first circuit board 50 such that metal wiring connectors C1 and C2 oppose one another. In the state in which hydrocarbon compound 70 is interposed between metal wiring connector C1 of first circuit board 50 and metal wiring connector C2 of second circuit board 60, metal wiring connectors C1 and C2 of both boards 50 and 60 are disposed opposite one another. In other words, in the state in which a hydrocarbon compound 70 having a C—H bond disassociation energy less than 950 kJ/mol is interposed between the metal composing metal wiring connector C1 of first circuit board 50 and the metal composing metal wiring connector C2 of second circuit board 60, metal wiring connectors C1 and C2 of both boards 50 and 60 are disposed opposite one another.

Then, in the state in which pressure is applied between metal wiring connectors C1 and C2 on both boards 50 and 60, the metal (copper) composing the metal wiring is heated to below its melting point. The pressure applied at this time is, for example, 0.3 to 2.0 MPa. Further, the heat applied is between 700 and 1000 degrees Centigrade, lower than the melting point of copper (1083 degrees Centigrade). Moreover, pressure and heat is applied between 30 and 60 seconds.

At this time, by heating hydrocarbon compound 70, hydrocarbon compound 70 is decomposed and hydrocarbon compound 70 has hydrogen separated therefrom to form a radical. Oxide film 52a and 62a formed on the metal surfaces is reduced at the same time the metal composing metal wiring connectors C1 and C2 on both boards bond together by dispersion due to the radical formed from the hydrocarbon compound.

Figure 18:
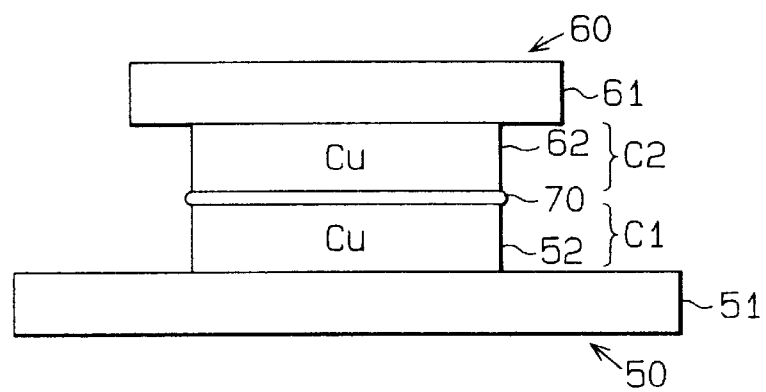
FIG. 18 is a cross-sectional view showing the mounting method of the second embodiment according to the present invention.

That is, the oxide film 52a on the surface of copper film 52 and the oxide film 62a on the surface of copper film 62a, in other words, the metal oxides 52a and 62a on the metal surfaces composing the metal wiring, are reduced by hydrocarbon 70. Clean metal surfaces are exposed by the reduction of oxides 52a and 62a. As a result, as shown in FIG. 18, the state of wetness is good, and the surface of copper film 52 on board 50 contacts with the surface of copper film 62 on board 60. Then, mutual dispersion of both coppers occurs (both coppers mutually disperse in the hard phase), as shown in FIG. 19, copper film 52 on board 50 is bonded together with copper film 62 on board 60.

In this manner, the oxide films 52a and 62a on the surfaces of the base metal (in the present embodiment, copper film 52 and 62) are degraded and the surfaces connected, resulting in the high connection reliability of component packages. In other words, by using hydrocarbon 70 as an oxidizer on oxide films 52a and 62a on the metal surfaces, both clean metal surfaces can contact, mutual dispersion can occur, and a favorable connection with high reliability can be obtained.

As above, similar with the second embodiment, even when the electrode space is small, a high connection reliability can occur in component packages (the connection between wiring).

In addition, in the aforementioned first through third embodiments, the hydrocarbon compound is only applied to metal wiring connector C1 on the first circuit board. However, it can be applied only to metal wiring connector C2 of the second circuit board or to both metal wiring connectors C1 and C2 on both boards.

Figure 20:
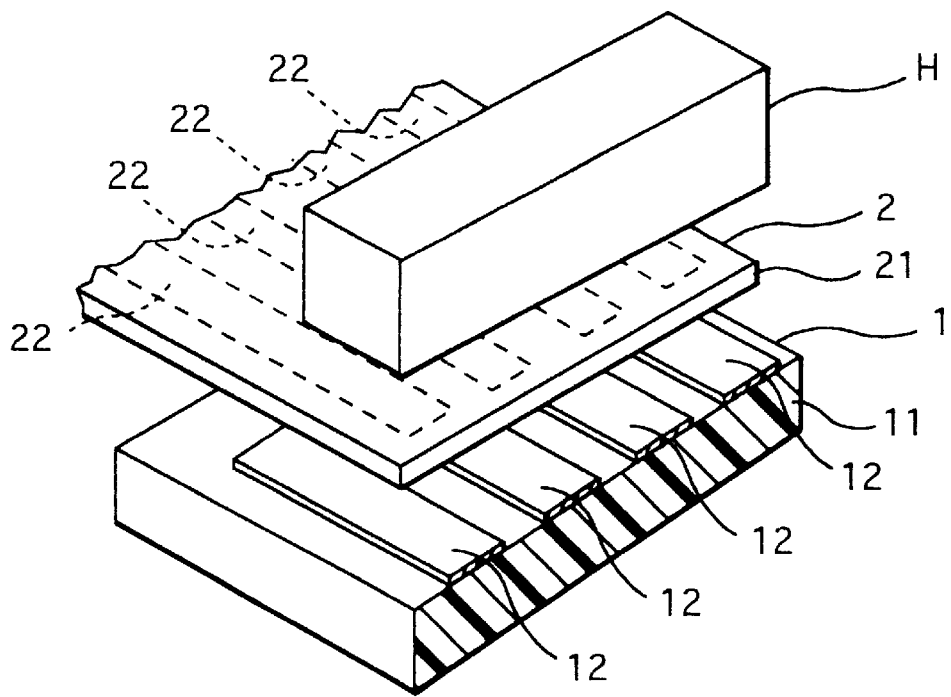
FIG. 20 is a perspective view showing the initial state of the heat-press-bonding step based on the present invention.
Figure 24:
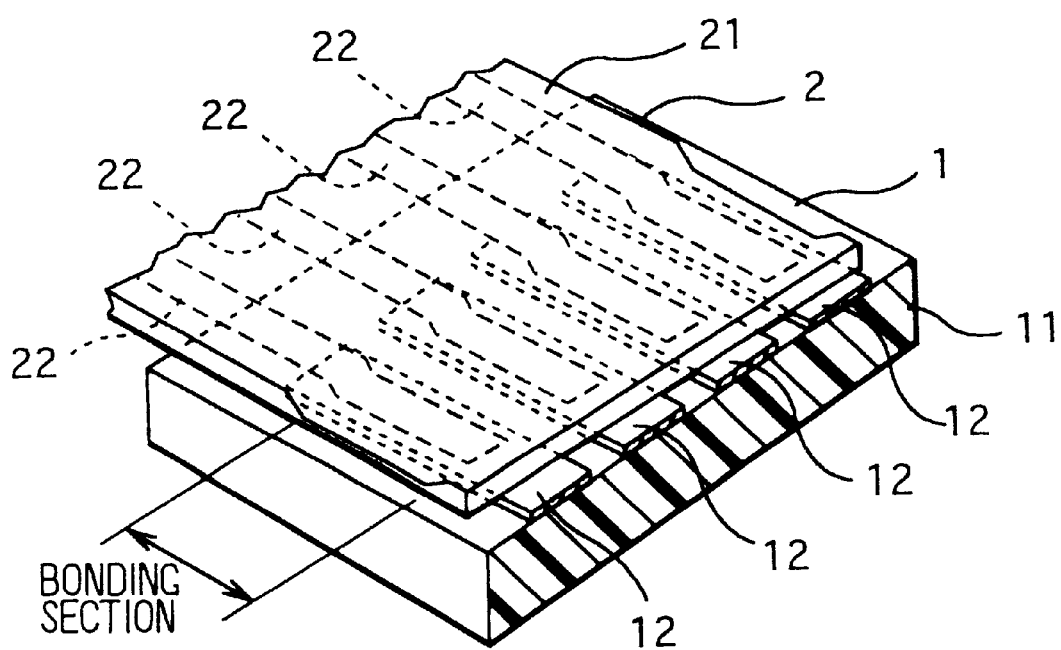
FIG. 24 is a perspective view showing the principal arrangement of a multiple circuit board made based on the present invention.

The circuit board connecting method as provided in a fourth embodiment of the present invention resides in a method of bonding together a printed circuit board 1 having a base plate 11 and a plurality of printed wire terminals 12 which are bonded to the surface of the base plate 11, and a flexible circuit board 2 having a film 21 made of thermoplastic resin and a plurality of conductive thick-film terminals 22 which are bonded to the surface of the film 21 as shown in FIG. 20. The circuit board connecting method of this embodiment is a manufacturing method of manufacturing a multiple circuit board 100 having a printed circuit board 1 and a flexible circuit board 2 connected together as shown in FIG. 24 by connecting the printed wire terminals 12 and the conductive thick-film terminals 22 correspondingly when the printed circuit board 1 and the flexible circuit board 2 are bonded.

Figure 21:
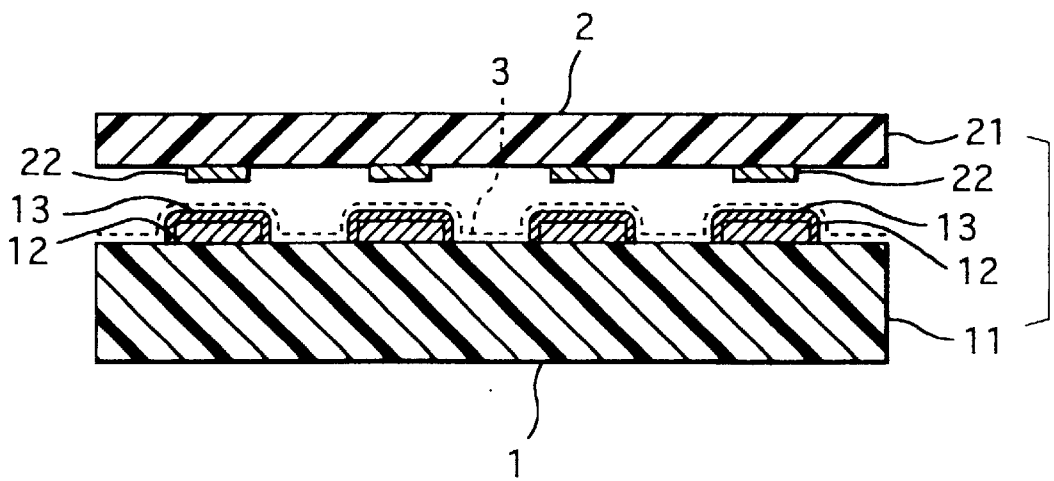
FIG. 21 is a cross-sectional diagram showing the principal arrangement of the heat-press-bonding step based on the present invention.

The base plate 11 of the printed circuit board 1 is a multiple circuit board made of base material of epoxy glass as shown in FIG. 21, and each printed wire terminal 12 is a connecting terminal of a printed wire made of copper foil formed on one surface of the base plate 11. The printed wire terminals 12 have their surfaces covered with a thin solder layer 13 called solder leveler. Solder forming the solder layer 13 is eutectic solder, having a fusing point of about 183° C.

After the alkane application step which will be described later, i.e., before the heat-press-bonding step, the printed circuit board 1 to be bonded to the flexible circuit board 2 has its surface covered with a thin layer of liquid alkane group 3. The alkane group 3 employed in this embodiment is tetradecane which is straight-chained saturated hydrocarbon including 14 carbon atoms in a molecule and has a boiling point of 174° C. Namely, the boiling point of the alkane group 3 may be lower than the fusing point of thermoplastic resin (PEN) which forms the film 21 of the flexible circuit board 2 as will be described next.

The film 21 of the flexible circuit board 2 including PEN (polyethylene naphthalate) and is a thermoplastic film which is thinner incomparably than the base plate 11 of the printed circuit board 1 and has a fusing point of about 270–280° C. The conductive thick-film terminals 22 are wire terminals which are made from a thick film of silver paste and formed by printing of polyester resin including a large quantity of fine silver powder.

The circuit board connecting method of this embodiment includes an alkane application step and a heat-press-bonding step.

The alkane application step is a preliminary step which applies the above-mentioned alkane group 3 to the portion of the surface of the printed circuit board 1 where the printed wire terminals 12 exist. A prescribed amount of the alkane group 3 is applied with a brush to the end face of the printed circuit board 1 to cover the range of bonding shown in FIG. 20.

The heat-press-bonding step heat-press-bonds the flexible circuit board 2 to the printed circuit board 1 with a heating tool H by positioning the printed wire terminals 12 and the conductive thick-film terminals 22 to face one another as shown in FIG. 20. The heating tool H is made of titanium having a shape of a bar with a square cross section. It is heated to a temperature of 230–240° C. and driven at a pushing force of around 2 MPa (about 20 kgf/cm²) to heat-press the flexible circuit board 2 to the printed circuit board 1 for 5 seconds. The film 21 of the flexible circuit board 2 is relatively thin, and therefore it heats up nearly to the temperature of the heating tool H.

Accordingly, in the heat-press-bonding step, the film 21 reaches the maximum temperature of around 230° C., lower than the fusing point (about 275° C.) of the thermoplastic resin (PEN) which forms the film 21 and higher than the boiling point (174° C.) of tetradecane as the alkane group 3. Therefore, the film 21 softens but does not melt, whereas the alkane group 3 boils. The eutectic solder which forms the solder layer 13 has a fusing point (183° C.) which is virtually equal to the boiling point (174° C.) of tetradecane as the alkane group 3. Therefore, it heats sufficiently in the heat-press-bonding step so that the solder layer 13 undergoes fusion when the alkane group 3 boils.

Figure 22:
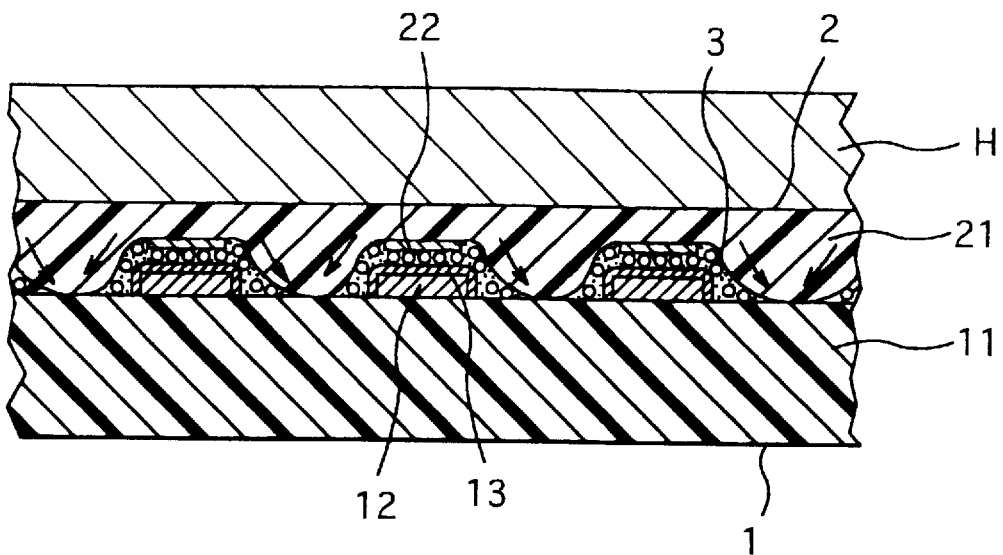
FIG. 22 is a cross-sectional diagram showing the intermediate state of the heat-press-bonding step based on the present invention.
Figure 23:
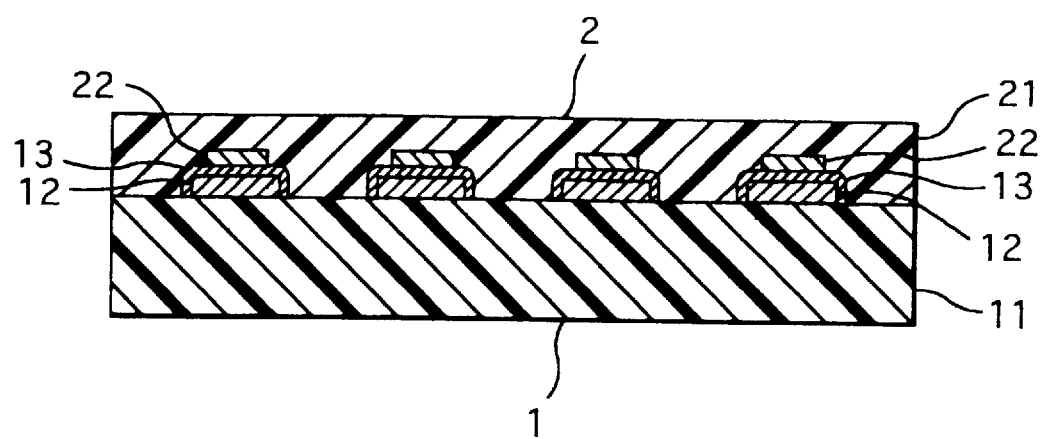
FIG. 23 is a cross-sectional diagram showing the bonded state after the heat-press-bonding step based on the present invention.

FIG. 20 and FIG. 21 show the initial state of the heat-press-bonding step. FIG. 22 shows the intermediate state amid the heat-press-bonding step, and FIG. 23 and FIG. 24 show the bonded state after the heat-press-bonding step. As shown in FIG. 23 and FIG. 24, the flexible circuit board 2 is tightly bonded at its bonding section to the printed circuit board 1 in the bonded state after the heat-press-bonding step.

Effect of Embodiment 4

The circuit board connecting method of this embodiment arranged as described above attains the following effectiveness. When the flexible circuit board 2 is heat-press-bonded to the printed circuit board 1 in the heat-press-bonding step described above, the alkane group 3 which has been applied in advance acts in two ways as follows.

Primarily, as shown in FIG. 22, the alkane group 3 boils instantaneously by being heated to a temperature above its boiling point, cleaning the surface of the printed wire terminals 12 of the printed circuit board 1 and the surface of the conductive thick-film terminals 22 of the flexible circuit board 2. As such, both members 12 and 22 are bonded easily. At this time, eutectic solder which forms the solder layer 13 has melted and is liquid due to heating to a temperature above its fusing point.

Consequently, by boiling, the alkane group 3 removes the oxide film formed on the surface of the solder layer 13 covering the printed wire terminals 12 of the printed circuit board 1. At the same time, oxides formed on the surface of the solder layer 13 are reduced to metals by the reducing action of the alkane group 3. Accordingly, the alkane group 3 exposes the metallic portion of the solder layer 13 not oxidized, and melts to cover the printed wire terminals 12. Similarly, because of boiling and the reducing action, the alkane group 3 removes the oxide film and contaminant which covers the surface of the conductive thick-film terminals 22 of the flexible circuit board 2. This exposes the metallic portion of the conductive thick-film terminals 22.

As a result, the metallic portion of the solder layer 13 which covers the printed wire terminals 12 and the metallic portion of the conductive thick-film terminals 22 are exposed and press-bonded by being in direct contact with one another at a temperature high enough to melt the solder layer 13. As a result, the printed wire terminals 12 and the conductive thick-film terminals 22 are firmly solder-bonded, which not only achieves strong bonding mechanically, but also achieves satisfactory conduction based on firm electrical connection.

Secondary, as shown in FIG. 22 again, the heated alkane group 3 soaks into the film 21 of the flexible circuit board 2, causing the film 21 to melt and swell slightly. Namely, thermoplastic resin which forms the film 21 not only increases in fluidity by the slight melting as the temperature rises, but it swells to seal the space between adjacent printed wire terminals 12. Consequently, the film 21 of the flexible circuit board 2 firmly bonds the surface of the base plate 11 between the printed wire terminals 12 on the surface of the printed circuit board 1 and the side face of the printed wire terminals 12 as shown again in FIG. 23. As a result, the printed circuit board 1 and the flexible circuit board 2 are bonded firmly to enhance the strength against peeling, and both members 1 and 2 are firmly bonded mechanically. Moreover, swelling and filling film 21 blocks emerging dew, preventing the short-circuiting and erosion caused by dew.

Namely, the heat-press-bonding step not only firmly connects the printed wire terminals 12 and the conductive thick-film terminals 22 electrically and mechanically, but also it firmly bonds the printed circuit board and the flexible circuit board mechanically. Moreover, the bonding section is sealed tightly by the film 21. Consequently, the short-circuiting caused by ions between adjacent terminals 12 and 22 is prevented, and the short-circuiting and erosion caused by emerging dew is also prevented. As a result, the reliability of connection between the printed circuit board 1 and the flexible circuit board 2 is improved.

At the end of the heat-press-bonding step of this embodiment, the flexible circuit board 2 is bonded to the printed circuit board 1 as shown in FIG. 24, and a multiple circuit board 100, with the printed wire terminals 12 of the printed circuit board 1 and the conductive thick-film terminals 22 of the flexible circuit board 2 being connected correspondingly, is manufactured.

As a result of the above, a printed circuit board 1 and a flexible circuit board 2 can be heat-press-bonded by merely applying an extremely inexpensive alkane group 3 to the bonding section of the printed circuit board 1. Consequently, the printed circuit board 1 and the flexible circuit board 2 can be connected at an extremely low material cost.

Also, the alkane application step can be finished instantaneously and the heat-press-bonding step can be finished in only 5 seconds, whereby the printed circuit board 1 and the flexible circuit board 2 can be connected efficiently in extremely short time and with little work.

Moreover, the bonding of the printed wire terminals 12 and conductive thick-film terminals 22 is electrically and mechanically firm. Also, the film 21 of the flexible circuit board 2 melts and swells to stick firmly to the printed circuit board 1, whereby the reliable bonding can be achieved. In addition, thermoplastic resin which forms the film 21 of the flexible circuit board 2 melts slightly into the alkane group 3. Also, the alkane group 3 soaks and swells to fill the space of the bonding section. As a result, the film 21 protrudes to fill the bonding section, and the bonding section does not develop the short-circuiting or defective connection due to emerging dew, whereby the reliable connection is achieved. Lastly, the circuit board connecting method based on this embodiment is sufficiently reliable in terms of connection, while being capable of connecting a printed circuit board 1 and a flexible circuit board 2 at an extremely low cost and in a short time.

Embodiment 5

The circuit board connecting method as embodiment 5 of this invention differs from the foregoing embodiment 4 in that the printed circuit board 1 does not have the solder layer 13 and that the alkane group 3 used is saturated hydrocarbon which mainly composed of cyclooctane. The remainder of the circuit board connecting method of this embodiment is identical to embodiment 4 inclusive of the various conditions of the heat-press-bonding step. Cyclooctane, which is the main component of the alkane group 3, is saturated hydrocarbon having a class 3 carbon structure and a boiling point of about 148° C.

The printed wire terminals 12 of the printed circuit board 1 are exposed, and the heat-press-bonding step initially connecting the printed wire terminals 12 of the printed circuit board 1 and the conductive thick-film terminals 22 of the flexible circuit board 2 directly. As such, the alkane group 3 having a low boiling point boils harshly to clean the surface of the printed wire terminals 12, and therefore the printed wire terminals 12 and the conductive thick-film terminals 22 are firmly connected even in the absence of the solder layer 13. The alkane group 3 exerts the reducing action also in this embodiment to remove the oxide film formed on the surface of the printed wire terminals 12 and conductive thick-film terminals 22 thereby to expose their metallic portions. This aids both members 12 and 22 to become bonded. Consequently, the printed wire terminals 12 and the conductive thick-film terminals 22 are also reliably electrically connected.

Next, the heated alkane group 3 soaks into the film 21 of the flexible circuit board 2, causing the film 21 to have an increased fluidity so that it seals the bonding section of the printed circuit board 1 and flexible circuit board 2 tightly.

Embodiment 6

The circuit board connecting method as embodiment 6 of this invention is a method of connecting a printed circuit board 1, which has printed wire terminals 12 but does not have a solder layer nor plating layer as in the case of the embodiment 5, and a flexible circuit board 2 which has conductive thick-film terminals 22 formed of silver paste.

The arrangement of this embodiment is basically the same as the arrangement of the embodiment 5, but is different from the embodiment 5 in the use of dicyclopentadiene for the alkane group. Dicyclopentadiene is an alkane group having class 3 carbon bond, with its C—H bond-dissociation energy ΔH being estimated to be about 916 kJ/mol as shown in FIG. 7. The C—H bond-dissociation energy ΔH is defined to be an energy level at which the alkane group undergoes thermal decomposition to release hydrogen thereby turning to the radical state as shown in FIG. 6.

Specifically, in this embodiment, the alkane group has a C—H bond-dissociation energy of about 916 kJ/mol, which is below 950 kJ/mol. The film of thermoplastic resin which forms the flexible circuit board 2 acts to seal the connecting section of the printed circuit board and flexible circuit board in the heat-press-bonding step.

Since, in this embodiment, the alkane group has a C—H bond-dissociation energy of about 916 kJ/mol which is below 950 kJ/mol, the reduction speed constant k (refer to FIG. 7) is large, and it exerts a strong reducing action for metallic oxides at a high temperature. As a result, metallic oxides which are liable to emerge on the surface of the printed wire terminals 12 and conductive thick-film terminals 22 are reduced, causing both terminals 12 and 22 to have a metal-to-metal junction. Consequently, even if a solder layer or plating layer is absent on the surface of the printed wire terminals 12, it not only enhances the mechanical bonding strength between both terminals 12 and 22, but also reduces the resistance of connection between both terminals to achieve the satisfactory electrical connection.

Figure 25:
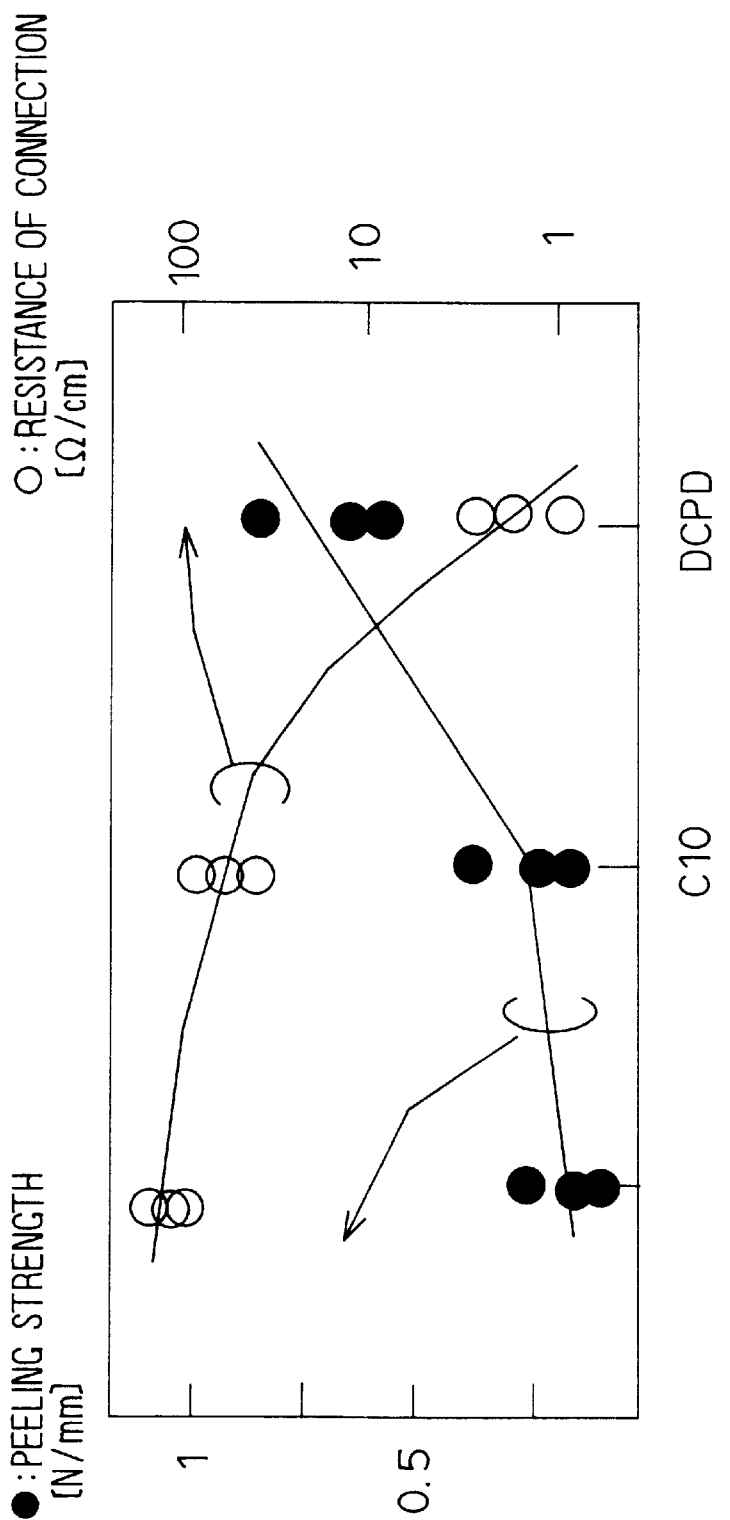
FIG. 25 is a graph showing an effect of the present invention.

Specifically, the peeling strength of this embodiment using dicyclopentadiene (DCPD) doubles as compared with the case of the absence of alkane group or the case of the alkane group of decane (C10) as shown by the mark of filled circle in FIG. 25. In addition, the connection resistance between both terminals 12 and 22 decreases drastically as compared to the absence of alkane groups or the alkane group of decane (C10) as shown by the mark of blank circle in FIG. 25.

Accordingly, the circuit board connecting method of this embodiment further increases the bonding strength between the printed circuit board 1 and the flexible circuit board 2 in addition to the effect of the preceding embodiment 5. Moreover, it has the effect of further reducing the resistance of connection between the printed wire terminals 12 and the conductive thick-film terminals 22 and achieves much better electrical connection. Obviously, these effects are attained even without the surface processing for the printed wire terminals 12 as where in the preceding embodiment 5, It is possible to alter the material of the printed wire terminals 12 or the material of the conductive thick-film terminals 22 in carrying out the circuit board connecting method. For example, the conductive thick-film terminals 22 may be formed of a paste of copper, silver-copper alloy or tin instead of the silver paste. The printed wire terminals 12 may undergo nickel-gold plating, copper-silver plating, copper-lead plating, or the like. Dicyclopentadiene as the alkane group 3 may be replaced with other alkane group having a C—H bond-dissociation energy of 950 kJ/mol or less. Any of these variant embodiments achieves the effect comparable to the above embodiment.

While the above-described embodiments refer to examples of usage of the present invention, it is understood that the present invention may be applied to other usage, modifications and variations of the same, and is not limited to the disclosure provided herein.

What is claimed is:

1. A method of connecting a first wiring connector on a first circuit board and a second wiring connector on a second circuit board, comprising:

disposing said first wiring connector on said first circuit board and said second wiring connector on said second circuit board, said first wiring connector disposed opposite said second wiring connector, said first wiring connector on said first circuit board composed of metal and said second wiring connector on said second circuit board composed of metal and having a hydrocarbon compound interposed therebetween, said hydrocarbon having a C—H bond disassociation energy less than 950 kJ/mol; and decomposing said hydrocarbon compound to form a radical, said hydrocarbon compound being decomposed by separating hydrogen from said hydrocarbon compound by heating said hydrocarbon compound and reducing oxide film on a surface of said metal of said first wiring connector and said second wiring connector with said radical formed from said hydrocarbon compound so that said first wiring connector on said first circuit board and said second wiring connector on said second circuit board are bonded by fusion or diffusion, wherein said hydrocarbon compound is at least a member selected from the group consisting of cyclooctane, tetramethylpentadecane, triphenylmethane, dicyclopentadiene, and dihydroanthracene.

2. The method according to claim 1, wherein said first wiring connector and said second wiring connector on said first and second circuit boards respectively are metal electrodes, solder being placed on top of and attached to at least said first wiring connector or said second wiring connector.

3. The method according to claim 1, wherein said first wiring connector and said second wiring connector bond together by fusing with said solder while said oxide film on the surface of said solder or said metal electrode is reduced by heating said hydrocarbon compound above a melting point of said solder.

4. The method according to claim 1, wherein said first wiring connector and said second wiring connector are made of copper.

5. The method according to claim 1, wherein said first wiring connector on said first circuit board is comprised of gold, said second wiring connector on said second circuit board is comprised of tin, said hydrocarbon compound is interposed between said gold and tin, and both metals are bonded together by diffusion by heating below a melting point of tin.

* * * * *